(12) United States Patent
Chan et al.

(10) Patent No.: US 6,207,534 B1
(45) Date of Patent: Mar. 27, 2001

(54) METHOD TO FORM NARROW AND WIDE SHALLOW TRENCH ISOLATIONS WITH DIFFERENT TRENCH DEPTHS TO ELIMINATE ISOLATION OXIDE DISHING

(75) Inventors: Lap Chan, San Francisco, CA (US); Cher Liang Cha; Teck Koon Lee, both of Singapore (SG)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/389,632

(22) Filed: Sep. 3, 1999

(51) Int. Cl.$^7$ ................................................. H01L 21/76
(52) U.S. Cl. ............................................ 438/427; 438/424
(58) Field of Search ..................................... 438/424, 427

(56) References Cited

U.S. PATENT DOCUMENTS

| | | |
|---|---|---|
| 4,211,582 * | 7/1980 | Horng et al. |
| 5,157,003 | 10/1992 | Tsuji et al. .......................... 437/229 |
| 5,473,186 * | 12/1995 | Morita. |
| 5,776,817 | 7/1998 | Liang ................................... 438/427 |
| 5,814,547 | 9/1998 | Chang .................................. 438/329 |
| 5,851,928 | 12/1998 | Cripe et al. ........................... 438/748 |
| 5,893,744 * | 4/1999 | Wang. |
| 6,018,186 * | 1/2000 | HSU. |

* cited by examiner

*Primary Examiner*—John F. Niebling
*Assistant Examiner*—Ron Pompey
(74) *Attorney, Agent, or Firm*—George O. Saile; Rosemary L.S. Pike

(57) ABSTRACT

A method of forming trenches having different depths for use in shallow trench isolations is achieved. Dishing problems due to isolation oxide thinning over wide trenches is eliminated. A silicon substrate is provided. A pad oxide is grown. A polishing stop of silicon nitride is deposited. An oxide layer is grown overlying the silicon substrate. The oxide layer, polishing stop layer, and pad oxide layer are etched through to the silicon substrate to form openings for planned first trenches. A polysilicon layer is deposited overlying the oxide layer and filling the openings for the planned first trenches. The polysilicon layer is polished down to the top surface of the oxide layer such that the polysilicon layer remains only in the openings of the planned first trenches. The oxide layer, polishing stop layer, and pad oxide layer are etched through to the silicon substrate to form openings for planned second trenches. The silicon substrate and the polysilicon layer are simultaneously etched to complete the first trenches and the second trenches, with the second trenches deeper than the first trenches, and with the oxide layer a hard mask, and the integrated circuit device is completed.

20 Claims, 4 Drawing Sheets

METHOD TO FORM NARROW AND WIDE SHALLOW TRENCH ISOLATIONS WITH DIFFERENT TRENCH DEPTHS TO ELIMINATE ISOLATION OXIDE DISHING

BACKGROUND OF THE INVENTION (1) Field of the Invention

The invention relates to a method of fabricating silicon structures, and more particularly, to the formation of narrow and wide shallow trench isolations with different depths to eliminate isolation oxide dishing problems.

(2) Description of the Prior Art

The use of shallow trench isolation (STI) for the formation of integrated circuit isolations has grown in the art due to the reduced surface area and improved topology of STI when compared to traditional local oxidation of silicon (LOCOS) schemes. One problem that is encountered in the use of STI is oxide dishing. Oxide dishing occurs, in part, due to pad deformation in the chemical mechanical polish (CMP) process used to planarize the STI structures. It is called dishing because the STI isolation oxide takes on the shape of a dish as the oxide in the trench is thinned by the CMP process. Dishing is especially pronounced on large or wide STI structures because the isolation oxide over these trenches is typically thinner than the oxide deposited over narrow trenches due to topological effects. Narrower STI structures demonstrate little or no dishing.

Referring to FIG. 1, a cross-section of a partially completed prior art integrated circuit is shown. A silicon substrate 10 is shown. A pad oxide layer 19 overlies the silicon substrate 10. A silicon nitride layer 20 overlies the pad oxide layer 19 as a polishing stop. Two narrow trenches 14 and one wide trench 18 have been etched into through the pad oxide layer 19 and the silicon nitride layer 20 and into the surface of the silicon substrate 10. The trenches have a common depth of LI because all were formed by the same reactive ion etch (RIE) process.

Referring to FIG. 2, an isolation oxide layer 22 has been deposited overlying the silicon nitride layer 20 and filling the trenches. Note how the topology of the trenches affects the topology of the isolation oxide layer 22. Where the isolation oxide layer 22 overlies the narrow trenches 14, it is relatively thick. Conversely, the isolation oxide layer 22 is relatively thin overlying the wide trench 18.

Referring to FIG. 3, the result of the chemical mechanical polish (CMP) is shown. The isolation oxide layer 22 has been polished down to the top surface of the silicon nitride layer 20 to complete the shallow trench isolations. Following the polish, however, significant dishing 24 is seen over the wide trench 18. This dishing 24 can cause increased current leakage and decreased gate oxide voltage breakdown. These problems at the active area interface reduce device yield.

Several prior art approaches disclose methods to create trenches having different depths into the substrate. U.S. Pat. No. 5,776,817 to Liang teaches a method to form trenches of different depths comprising: forming sacrificial refractory metal layers of different thickness, annealing the metal layers to create metal silicide layers of different depths into the underlying silicon substrate, and then removing the refractory metal and silicide layers to reveal trenches of different depths. U.S. Pat. No. 5,814,547 to Chang discloses a process to etch trenches using a microloading effect to cause the trenches to be etched to different depths. U.S. Pat. No. 5,851,928 to Cripe et al discloses a process to etch features of different depths in a single wet isotropic etching step by using a mask layer with different sized openings. U.S. Pat. No. 5,157,003 to Tsuji et al teaches a process to etch trenches of different depths. Selective exposure of phenol resin positive photoresist is used to define etching areas. Two etching steps are performed to form shallow trenches of two different depths.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations in which isolation oxide dishing is eliminated.

A yet further object of the present invention is to eliminate isolation oxide dishing in shallow trench isolations by forming wide trenches of lesser depth than narrow trenches.

Another object of the present invention is to provide a method to fabricate shallow trenches of different depths in the same etching step.

In accordance with the objects of this invention, a new method of fabricating shallow trench isolations has been achieved. A silicon substrate is provided. A pad oxide layer is formed overlying the silicon substrate. A polishing stop layer is formed overlying the pad oxide layer. An oxide layer is deposited overlying the polishing stop layer. The oxide layer, polishing stop layer, and pad oxide layer are etched through to the top surface of the silicon substrate to form openings for planned first trenches. A polysilicon layer is deposited overlying the oxide layer and filling the openings for the planned first trenches. The polysilicon layer is polished down to the top surface of the oxide layer such that the polysilicon layer remains only in the openings of the planned first trenches. The oxide layer, polishing stop layer, and pad oxide layer are etched through to the top surface of the silicon substrate to form openings for planned second trenches. The polysilicon layer and the silicon substrate are etched simulataneously to complete the first trenches and the second trenches where the second trenches are etched deeper than the first trenches and where the oxide layer acts as an etching mask. An isolation oxide layer is deposited overlying the oxide layer and filling the first trenches and the second trenches. The isolation oxide layer and the oxide layer are polished down to the top surface of the polishing stop layer to complete the shallow trench isolations, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
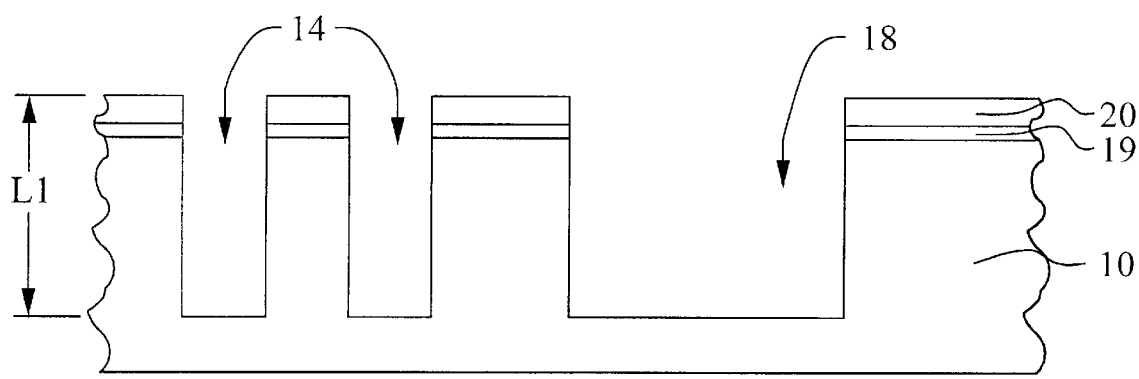
FIGS. 1 through 3 schematically illustrate in cross-section partially completed prior art shallow trench isolations in an integrated circuit device.
Figure 2:
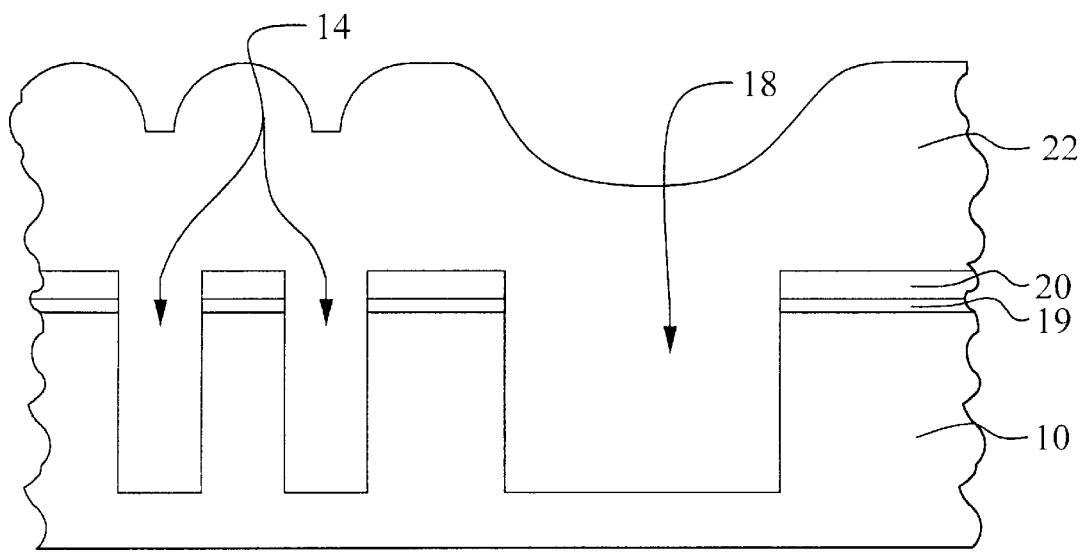
Figure 3:
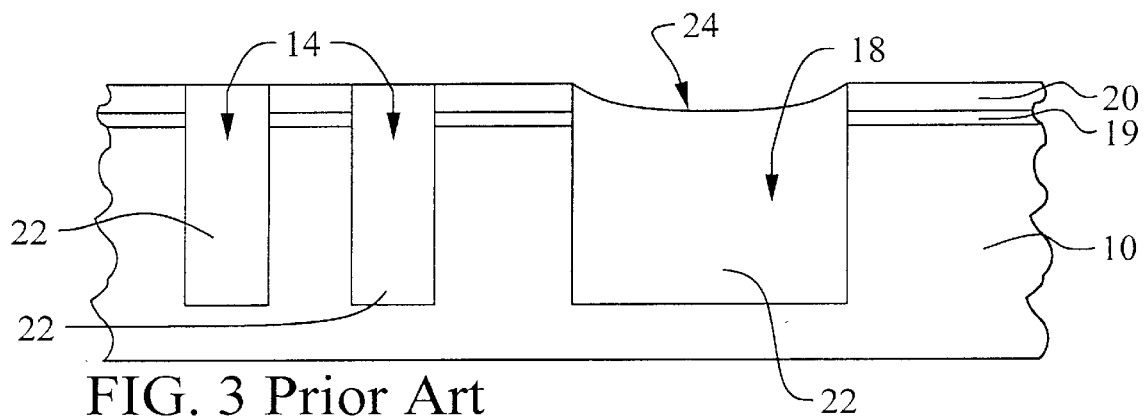
Figure 4:
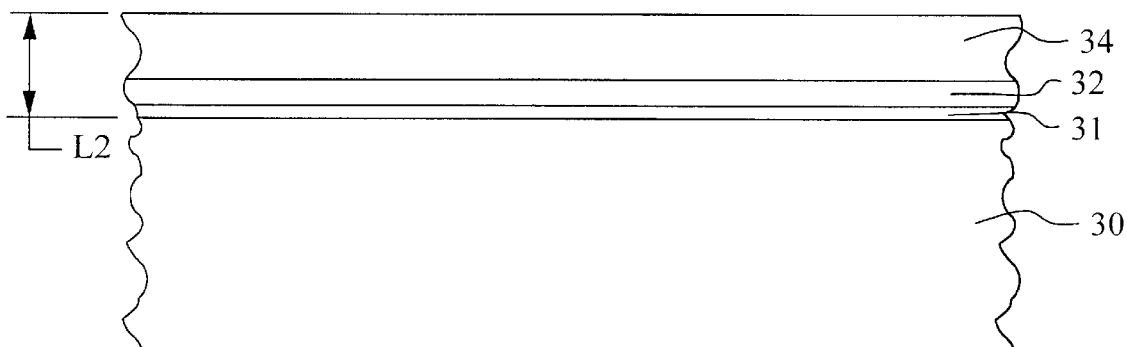
FIGS. 4 through 11 schematically illustrate in cross-sectional representation a preferred embodiment of the present invention.

Referring now more particularly to FIG. 4, there is illustrated a cross section of a partially completed integrated circuit device. The silicon substrate 30 is preferably composed of monocrystalline silicon. A pad oxide layer 31 is grown overlying the silicon substrate 30.

The pad oxide layer 31 comprises silicon dioxide grown by thermal oxidation of the silicon substrate 30. A polishing stop layer 32 is deposited overlying the pad oxide layer 31. The polishing stop layer 32 comprises silicon nitride deposited by CVD. An oxide layer 34 is deposited overlying the polishing stop layer 32. The oxide layer 34 is silicon dioxide deposited by a CVD process.

The thickness L2 of the combined stack of the pad oxide layer 31, polish stopping layer 32, and the oxide layer 34 is an important feature of the present invention. It is a goal of the present invention to create shallow trenches of different depths. More particularly, narrow width trenches will be formed to a greater depth than wide width trenches. By making the narrow trenches deeper, the present invention will eliminate isolation oxide thinning over the wide trenches. In this way, the dishing problem over the wide trenches will also be eliminated. As will be seen, the thickness L2 of the combined stack directly controls the difference in depth between the narrow and wide trenches. This is advantageous because the thickness of the combined stack of pad oxide layer 31, polishing stop layer 32, and oxide layer 34 can be controlled precisely using conventional processes. In the preferred embodiment, the pad oxide layer 31 is deposited to a thickness of between about 100 Angstroms and 200 Angstroms. The polishing stop layer 32 is deposited to a thickness of between about 1000 Angstroms and 2000 Angstroms. The oxide layer 34 is deposited to a thickness of between about 1,000 Angstroms and 3,000 Angstroms.

Typically, wide trenches are between about 1 micron and 100 microns wide. Narrow trenches are between about 0.24 microns and 0.5 microns wide. The depth of the narrow trenches can vary depending on the process set up. The overall thickness of the composite stack, made up of the pad oxide layer 31, the polishing stop layer 32, and the oxide layer 34, will depend directly on the depth of the narrow trenches. In the preferred embodiment, the thickness of the composite stack is between about ½ and ¾ of the depth of the narrow trenches.

Figure 5:
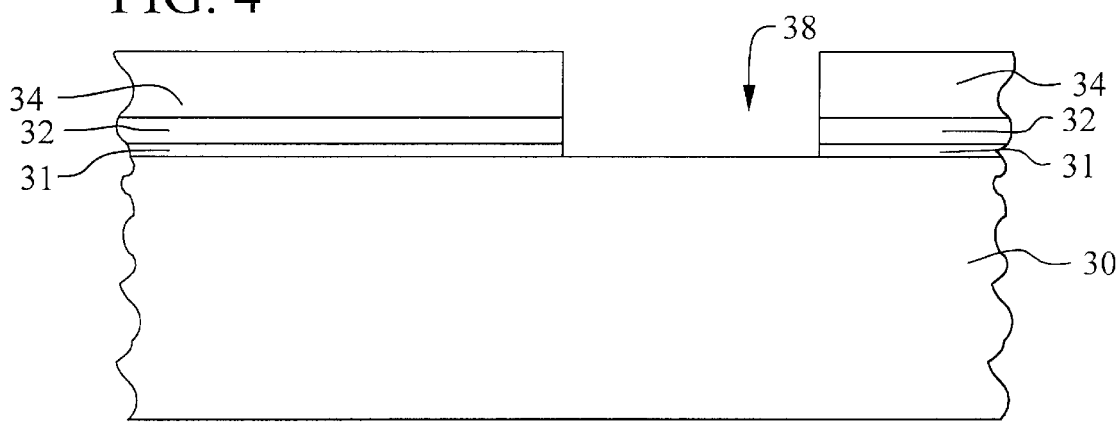

Referring now to FIG. 5, the oxide layer 34, the polishing stop layer 32, and the pad oxide layer 31 are etched through where not protected by a mask, that is not shown, to the top surface of the silicon substrate 30 to form openings 38 for planned wide trenches. The oxide etch step is performed using conventional reactive ion etching (RIE) or plasma dry etching.

Figure 6:
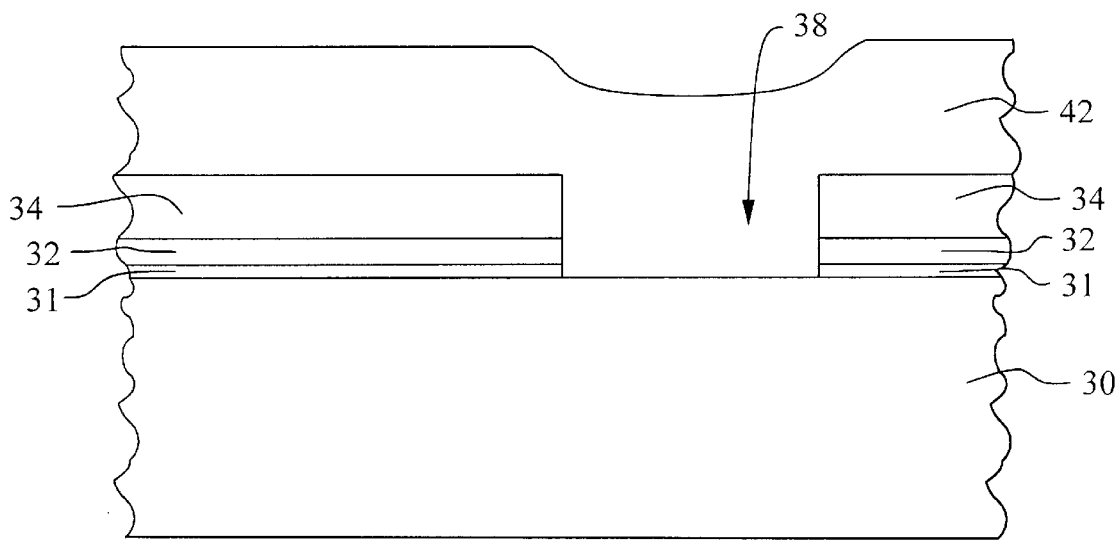

Referring now to FIG. 6, a polysilicon layer 42 is deposited overlying the oxide layer 34 and filling the openings 38 for the planned wide trenches. The polysilicon layer 42 is preferably deposited using a conventional low pressure chemical vapor deposition (LPCVD) process. The polysilicon layer is deposited to a thickness of between about 2,000 Angstroms and 4,000 Angstroms. The thickness of the polysilicon layer 42 depends on the thickness of the composite stack of the pad oxide layer 31, the polishing stop layer 32, and the oxide layer 34.

Figure 7:
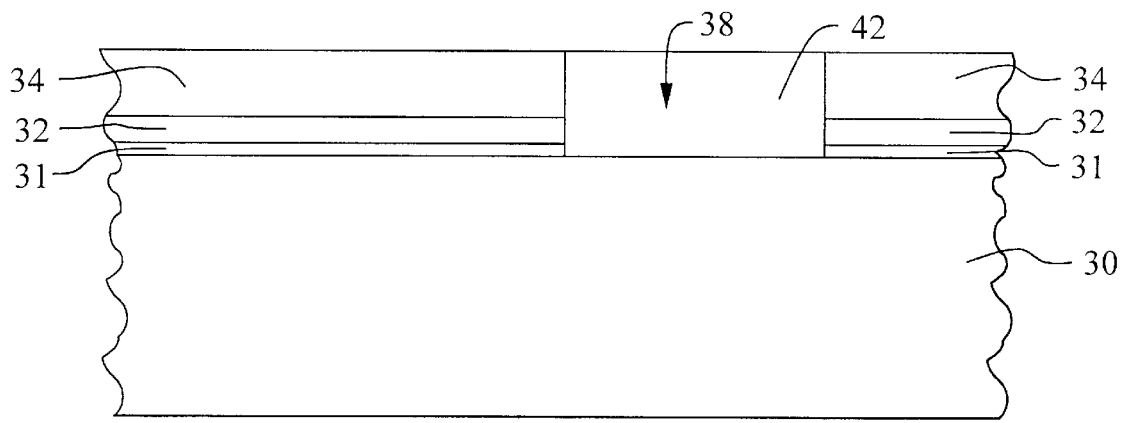

Referring now to FIG. 7, another important aspect of the present invention is shown. The polysilicon layer 42 is polished down to the top surface of the oxide layer 34 such that the polysilicon layer 42 remains only in the openings 38 of the planned wide trenches. This step is performed using a conventional chemical mechanical polishing (CMP) step that selectively polishes away polysilicon while stoping at silicon oxide. As can be seen, the combined thickness of the oxide layer 34, the polishing stop layer 32, and the pad oxide layer 31 establishes the thickness of the polysilicon layer 42 following the CMP step.

Figure 8:
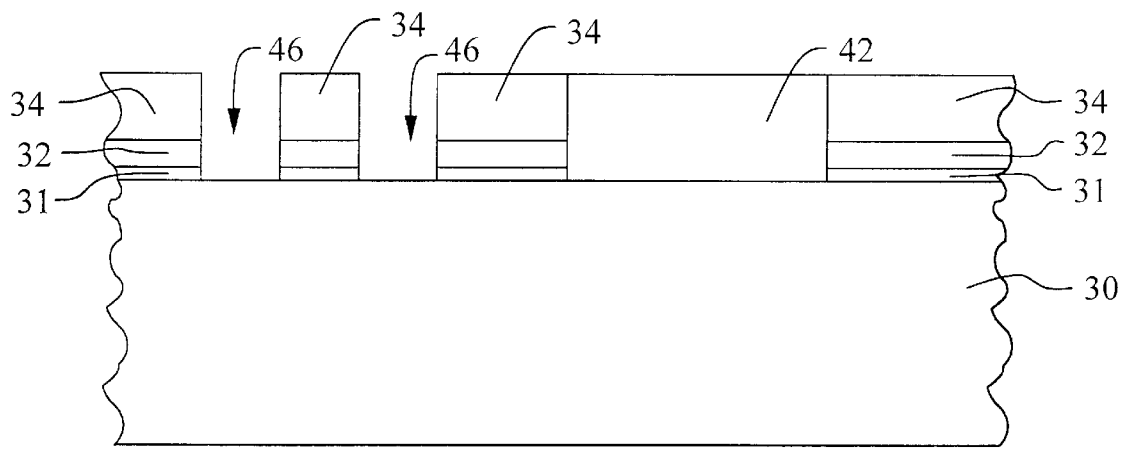

Referring now to FIG. 8, the oxide layer 34, the polishing layer 32, and the pad oxide layer 31 are etched through, where not protected by a mask that is not shown, to the top surface of the silicon substrate 30 to form openings 46 for planned narrow trenches. This etching step is performed using a conventional RIE oxide etch or a plasma dry etch.

Figure 9:
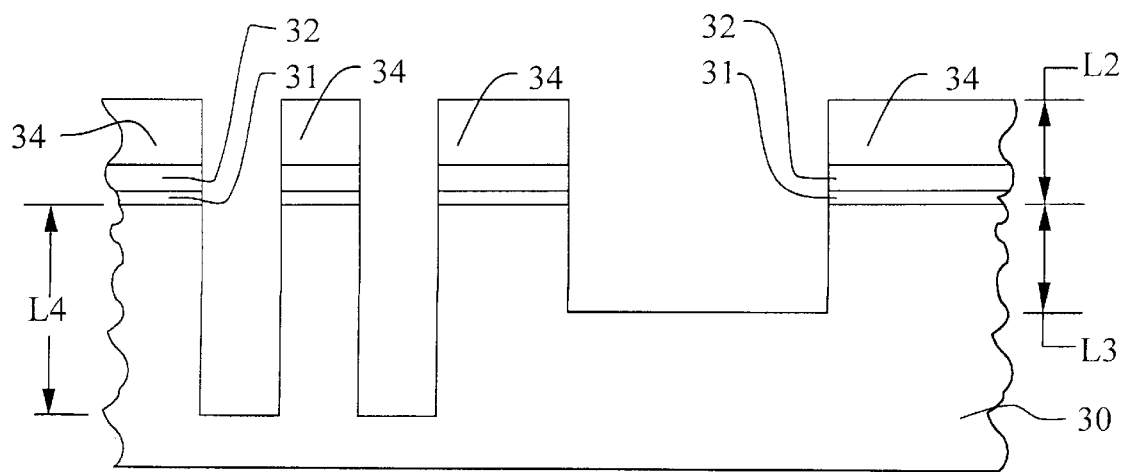

Referring now to FIG. 9, another important aspect of the present invention is shown. The polysilicon layer 42 is etched through and the silicon substrate 30 is etched. The oxide layer 34 acts as a hard mask. This etching step completes the wide trenches and the narrow trenches. The polysilicon layer 42 is completely etched away. The narrow trenches are etched deeper into the silicon substrate 30, than the wide trenches.

The preferred reactive ion etch (RIE) process for the trench etch uses a conventional etching chemistry comprising $HBr$, $Cl_2$ and $O_2$. With this chemistry, the etch rate for the silicon substrate 30 and the polysilicon layer 42 are nearly the same. Therefore, the difference in the depth L4 of the narrow trenches and the depth L3 of the wide trenches is simply the thickness L2 of the polysilicon layer 42. As was shown earlier, the polysilicon layer 42 was polished down to the same thickness as the composite stack. Therefore, the difference in trench thickness is controlled by the thickness L2 of the combined oxide layer 34, polishing stop layer 32, and pad oxide layer 31. For example, the narrow trenches may be between about 3,000 Angstroms and 5,000 Angstroms deep and the wide trenches may be between about 1,000 Angstroms and 3,000 Angstroms deep.

Figure 10:
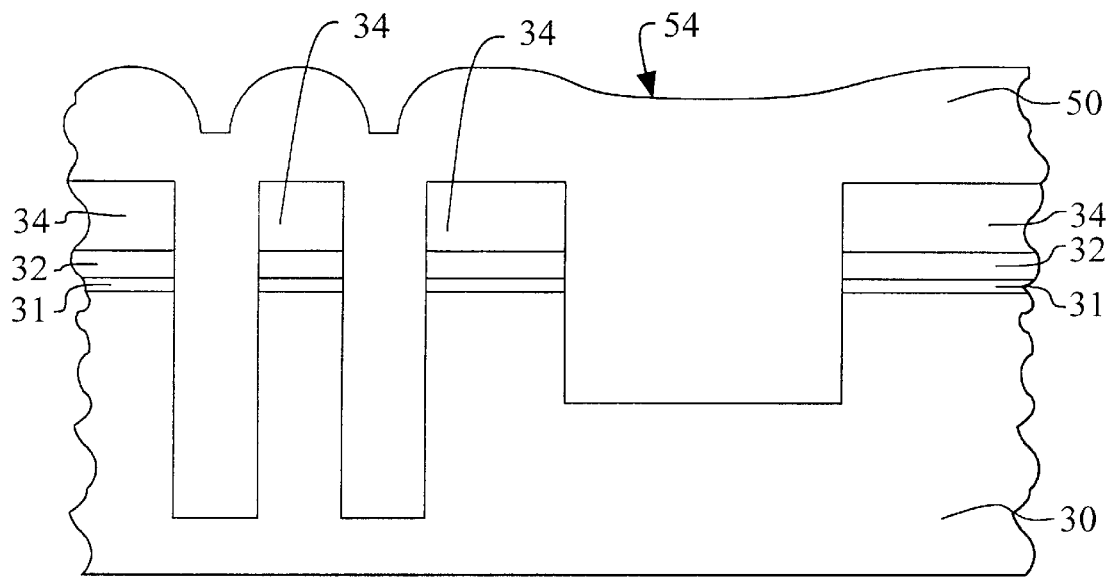

Referring now to FIG. 10, an isolation oxide layer 50 is deposited overlying the oxide layer 34, the silicon substrate 30 and filling the wide trenches and the narrow trenches. The isolation oxide layer 50 is preferably deposited by chemical vapor deposition (CVD). The isolation oxide layer is deposited to a thickness of between about 5,000 Angstroms and 10,000 Angstroms. The importance of the different trench depths can now be seen. Because of the more shallow depth of the wide trench when compared to the narrow trenches, little or no isolation oxide layer 50 thinning is seen the region overlying wide trench 54. By eliminating thinning of the isolation oxide layer 50, dishing is also eliminated.

Figure 11:
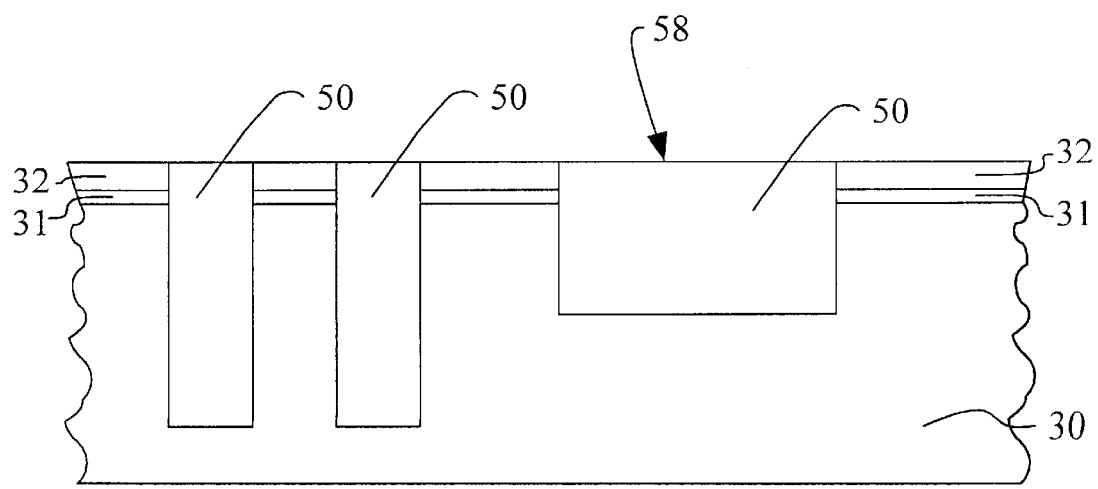

Referring now to FIG. 11, the isolation oxide layer 50 and the oxide layer 34 are polished down to the top surface of polishing stop layer 32 to complete the shallow trench isolations. The polishing step is completed using a chemical mechanical polishing operation. The integrated circuit device is then completed as is conventional in the art. Significantly, no dishing is seen overlying the wide trench region 58. Elimination of dishing will also eliminate the dishing induced problems of increased current leakage, decreased gate oxide voltage breakdown, and reduced device yield.

As shown in the preferred embodiment, the present invention provides a very manufacturable process for fabricating shallow trench isolations of different depths that eliminate isolation oxide dishing in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method of forming trenches having two different depths into a silicon substrate in the fabrication of an integrated circuit device comprising:

providing a silicon substrate;

depositing an oxide layer overlying said silicon substrate;

etching through said oxide layer to the top surface of said silicon substrate to form openings for planned first trenches;

depositing a polysilicon layer overlying said oxide layer and filling said openings for said planned first trenches;

polishing down said polysilicon layer to the top surface of said oxide layer such that said polysilicon layer remains only in said openings of said planned first trenches;

thereafter etching through said oxide layer to the top surface of said silicon substrate to form openings for planned second trenches;

etching simultaneously said silicon substrate and said polysilicon to complete said first trenches and said second trenches, wherein said etching forms said second trenches deeper than said first trenches and wherein said oxide layer acts as a hard mask; and completing the fabrication of the integrated circuit device.

2. The method according to claim 1 wherein said oxide layer is deposited to a thickness of between about 1,000 Angstroms and 3,000 Angstroms.

3. The method according to claim 1 wherein said polysilicon layer is deposited to a thickness of between about 2,000 Angstroms and 4,000 Angstroms.

4. The method according to claim 1 wherein said first trenches are wider than said second trenches.

5. The method according to claim 1 wherein said step of polishing down said polysilicon layer is by chemical mechanical polishing.

6. The method according to claim 1 wherein said step of etching simultaneously said silicon substrate and said polysilicon layer is by a reactive ion etch using etching chemistry comprising HBr, $Cl_2$ and $O_2$.

7. A method of forming shallow trench isolations in the fabrication of an integrated circuit device comprising:

providing a silicon substrate;

growing a pad oxide layer overlying said silicon substrate;

depositing a polishing stop layer overlying said pad oxide layer;

depositing a oxide layer overlying said polishing stop layer;

etching through said oxide layer, said polishing stop layer, and said pad oxide layer to the top surface of said silicon substrate to form openings for planned first trenches;

depositing a polysilicon layer overlying said oxide layer and filling said openings for said planned first trenches;

polishing down said polysilicon layer to the top surface of said oxide layer such that said polysilicon layer remains only in said openings of said planned first trenches;

thereafter etching through said oxide layer, said polishing stop layer, and said pad oxide layer to the top surface of said silicon substrate to form openings for planned second trenches;

etching simultaneously said silicon substrate and said polysilicon layer to complete said first trenches and said second trenches wherein said etching forms said second trenches deeper than said first trenches and wherein said oxide layer acts as a hard mask;

depositing an isolation oxide layer overlying said oxide layer and said silicon substrate and filling said first trenches and said second trenches;

polishing down said isolation oxide layer and said oxide layer to said polishing stop layer to complete the shallow trench isolations; and completing the fabrication of the integrated circuit device.

8. The method according to claim 7 wherein said pad oxide layer is grown to a thickness of between about 100 Angstroms and 200 Angstroms.

9. The method according to claim 7 wherein said polishing stop layer comprises silicon nitride deposited to a thickness of between about 1,000 Angstroms and 2,000 Angstroms.

10. The method according to claim 7 wherein said oxide layer is deposited to a thickness of between about 1,000 Angstroms and 3,000 Angstroms.

11. The method according to claim 7 wherein said polysilicon layer is deposited to a thickness of between about 2,000 Angstroms and 4,000 Angstroms.

12. The method according to claim 7 wherein said first trenches are wider than said second trenches.

13. The method according to claim 7 wherein said step of polishing down said polysilicon layer is by chemical mechanical polishing.

14. The method according to claim 7 wherein said step of etching simultaneously said silicon substrate and said polysilicon layer is by a reactive ion etch using etching chemistry comprising HBr, $Cl_2$ and $O_2$.

15. The method according to claim 7 wherein said isolation oxide layer is deposited by chemical vapor deposition to a thickness of between about 5,000 Angstroms and 10,000 Angstroms.

16. The method according to claim 7 wherein said step of polishing down said isolation oxide layer is by chemical mechanical polishing.

17. A method of forming shallow trench isolations in the fabrication of an integrated circuit device comprising:

providing a silicon substrate;

growing a pad oxide layer overlying said silicon substrate;

depositing a polishing stop layer of silicon nitride overlying said pad oxide layer;

depositing an oxide layer overlying said polishing stop layer;

etching through said oxide layer, said polishing stop layer, and said pad oxide layer to the top surface of said silicon substrate to form openings for planned wide trenches;

depositing a polysilicon layer overlying said oxide layer and filling said openings for said planned wide trenches; polishing down said polysilicon layer to the top surface of said oxide layer such that said polysilicon layer remains only in said openings of said planned wide trenches wherein said polishing down is by chemical mechanical polishing;

thereafter etching through said oxide layer, said polishing stop layer, and said pad oxide layer to the top surface of said silicon substrate to form openings for planned narrow trenches;

etching simultaneously said silicon substrate and said polysilicon layer to complete said wide trenches and said narrow trenches wherein said etching forms said narrow trenches deeper than said wide trenches and wherein said oxide layer acts as a hard mask;

depositing an isolation oxide layer overlying said oxide layer and said silicon substrate and filling said wide trenches and said narrow trenches;

polishing down said isolation oxide layer and said oxide layer to said polishing stop layer to complete the shallow trench isolations wherein said polishing down is by chemical mechanical polishing; and completing the fabrication of the integrated circuit device.

18. The method according to claim 17 wherein said polishing stop layer is grown to a thickness of between about 1,000 Angstroms and 2,000 Angstroms.

19. The method according to claim 17 wherein said oxide layer is grown to a thickness of between about 1,000 Angstroms and 3,000 Angstroms.

20. The method according to claim 17 wherein said step of etching simultaneously said silicon substrate and said polysilicon layer is by a reactive ion etch using etching chemistry comprising HBr, $Cl_2$ and $O_2$.

* * * * *